United States Patent
Stanton et al.

(10) Patent No.: US 7,046,339 B2
(45) Date of Patent: May 16, 2006

(54) OPTIMIZED OPTICAL LITHOGRAPHY ILLUMINATION SOURCE FOR USE DURING THE MANUFACTURE OF A SEMICONDUCTOR DEVICE

(75) Inventors: William A. Stanton, Boise, ID (US); Jeffrey L. Mackey, Boise, ID (US)

(73) Assignee: Micron Technology, Inc., Boise, ID (US)

(*) Notice: Subject to any disclaimer, the term of this patent is extended or adjusted under 35 U.S.C. 154(b) by 50 days.

(21) Appl. No.: 10/794,339

(22) Filed: Mar. 5, 2004

(65) Prior Publication Data

US 2005/0195379 A1    Sep. 8, 2005

(51) Int. Cl.
G03B 27/72    (2006.01)
G02B 3/00    (2006.01)

(52) U.S. Cl. .................................. 355/71; 359/650
(58) Field of Classification Search ............. 355/53, 355/67, 71; 359/565, 569
See application file for complete search history.

(56) References Cited

U.S. PATENT DOCUMENTS 6,245,468 B1    6/2001  Futrell et al. .................. 430/5

6,452,662 B1 *    9/2002  Mulkens et al. ............... 355/67

OTHER PUBLICATIONS

Frank Schellenberg, "A Little Light Magic", IEEE Spectrum, Sep. 2003, pp. 34-39.
"LithoCruiser" Product Brochure, ASML MaskTools, undated, 2 pages.
"LithoCruiser", Product Brochure, ASML MaskTools, 2002, 3 pages.

* cited by examiner

Primary Examiner—Michael Tokar
Assistant Examiner—Vivian Nelson
(74) Attorney, Agent, or Firm—Kevin D. Martin

(57) ABSTRACT

A method and structure for optimizing an optical lithography illumination source comprises a shaped diffractive optical element (DOE) interposed between the illuminator and a lens during the exposure of a photoresist layer over a semiconductor wafer. The DOE may, in some instances, increase depth of focus, improve the normalized image log-slope, and improve pattern fidelity. The DOE is customized for the particular pattern to be exposed. Descriptions and depictions of specific DOE's are provided. Additionally, a pupilgram having a particular pattern, and methods for forming the pupilgram, are discussed.

12 Claims, 17 Drawing Sheets

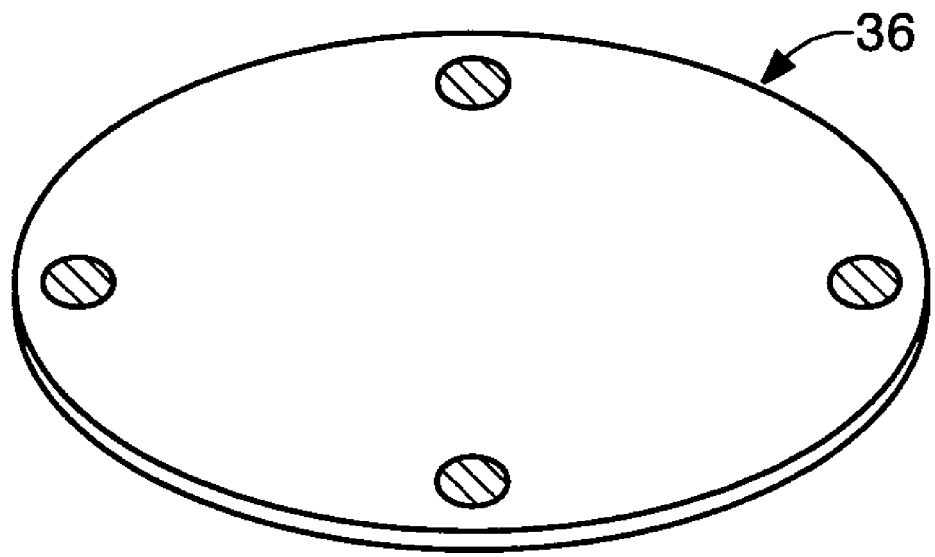
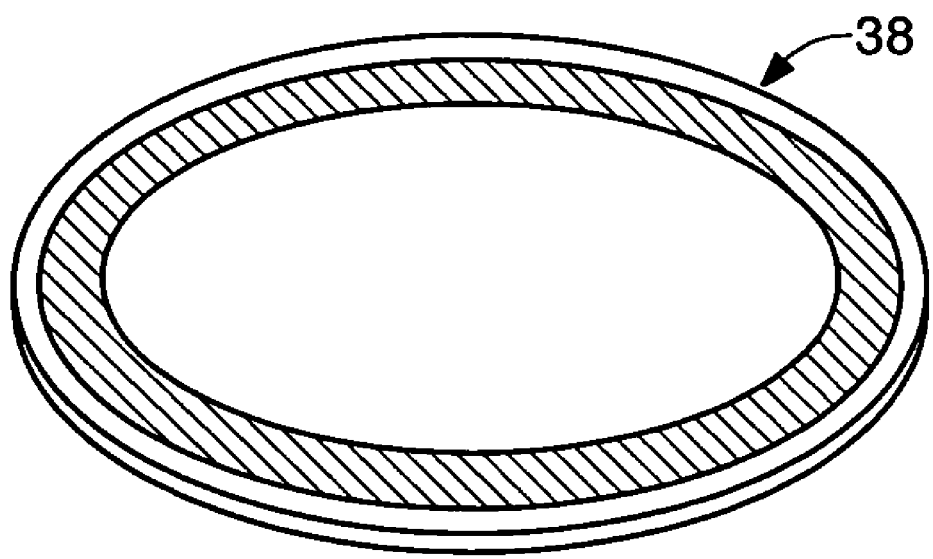
FIG. 3
(RELATED ART)

US 7,046,339 B2

OPTIMIZED OPTICAL LITHOGRAPHY ILLUMINATION SOURCE FOR USE DURING THE MANUFACTURE OF A SEMICONDUCTOR DEVICE

FIELD OF THE INVENTION

This invention relates to the field of semiconductor manufacture and, more particularly, to a method and structure for optimizing optical lithography during the formation of a semiconductor device.

BACKGROUND OF THE INVENTION

During the formation of a semiconductor device many features such as word lines, digit lines, contacts, and other features are commonly formed over a semiconductor wafer. A goal of semiconductor device engineers is to form as many of these features in a given area as possible to increase yield percentages and to decrease manufacturing costs.

All heterogeneous structure on a semiconductor wafer requires lithography. Optical lithography, the lithographic method most used in leading-edge wafer processing, comprises projecting coherent light of a given wavelength from an illumination source (illuminator) through a quartz photomask or reticle having a chrome pattern thereon, and imaging that pattern onto a resist-coated wafer. The light chemically alters the photoresist and allows the exposed photoresist (if positive resist is used) or the unexposed photoresist (if negative resist is used) to be rinsed away using a developer.

With decreasing feature sizes, the limits of optical lithography are continually being tested and lithographic methods and materials are continually being improved through various developments, generally referred to as resolution enhancement techniques (RET's). RET's alter various aspects of the lithographic process to optimize the size and shape of a desired feature. For example, the wavelength of light used to expose the photoresist may be decreased, as longer wavelengths cannot resolve the decreasing feature sizes. The wavelength used with lithographic equipment has decreased from 365 nanometers (nm) in the mid-1980's to the current standard of 193 nm. Another RET includes optical proximity correction, which uses subresolution changes in the chrome pattern on the photomask or reticle to optimize the shape of the light focused on the photoresist. Without optical proximity correction, the chrome pattern is a scaled shape of the pattern which is to be produced. With very small features a scaled shape does not produce the desired pattern due to diffraction effects. However, the chrome photomask features can be modified in a manner that attempts to account for these diffraction effects. U.S. Pat. No. 6,245,468 by Futrell et al., assigned to Micron Technology, Inc. and incorporated herein by reference as if set forth in its entirety, describes an optical proximity correction apparatus and method. A third RET uses unequal photomask thickness of the quartz on which the chrome is formed at selected locations between the chrome to provide a phase-shift photomask. Phase shifting sets up destructive interference between adjacent light waves to enhance the pattern formed on the photoresist.

Another resolution enhancement technique is off-axis illumination, which improves the resolution of repeating patterns found in semiconductor device manufacture. FIG. 1 depicts an apparatus comprising off-axis illumination, and depicts an illuminator 10 comprising a laser which provides a coherent light source 12, an optical element 14, a zoom axicon 16, a first reflector 18, an optical homogenizer 20, a blade 22, a second reflector 24, a vertical photomask 26, a lens 28, and a wafer 30 comprising a layer of photoresist (not individually depicted).

In use, the coherent light 12 is output by the illuminator 10, which travels through the optical element 14. The optical element, which in FIG. 1 is depicted as a dipole element, directs the light in particular patterns of angles and improves the light pattern focused on the photoresist. In use, the dipole optical element 14 is used in FIG. 1 to expose a vertical photomask. It is then rotated 90° to expose the horizontal photomask 32 as depicted in FIG. 2. After exiting the optical element 14, the light reaches the zoom axicon which allows some control over the size and position of the light source 12. Depending on the equipment used, the direction of light output from the zoom axicon may be changed 90° by the first reflector 18. The optical homogenizer 20 normalizes the intensity of light across the coherent beam such that any granularity is removed. In some instances a blade 22 is used instead of the optical element 14, for example during testing of a particular pattern. A second reflector 24 may change the direction of the source 12 depending on the equipment used. The source 12 then reaches the chromed reticle, depicted as a vertical reticle in FIG. 1 and a horizontal reticle in FIG. 2, which determines the pattern which is focused through the lens 28 and onto the photoresist which covers the semiconductor wafer 30.

A structure similar to this, as well as the other RET's previous listed, are described and illustrated in *A Little Light Magic*, IEEE Spectrum, September 2003, pp. 34–39.

While a dipole element is depicted in FIGS. 1 and 2, other optical elements are used for various patterns in addition to the dipole element 14 depicted in FIG. 1. FIG. 3 depicts a quadrupole element 36 and an annular element 38.

Melioration to resolution enhancement techniques which would to improve the pattern produced on a photoresist layer during the formation of a semiconductor device would be desirable.

SUMMARY OF THE INVENTION

The present invention provides a new method and apparatus which, among other advantages, improves optical lithography process latitude when forming semiconductor device features near the lithographic resolution limit. In accordance with one embodiment of the invention, a diffractive optical element (DOE) having a novel pattern is used to shape the coherent beam. The DOE is interposed between the illuminator and the photomask to configure the light pattern produced by the illuminator. For example, the DOE may be affixed to the illuminator or be affixed in another location between the illuminator and the photomask or reticle to shape the coherent beam. The DOE has one of various defined shapes tailored to the general pattern being transferred to a photoresist layer which covers a semiconductor substrate assembly comprising a wafer.

A first specific DOE or blade shape is depicted by FIG. 5, a second is depicted by FIG. 8, and a third is depicted by FIG. 11. A first particular light pattern produced by one of the embodiments of the invention is depicted schematically in FIG. 10, and a second particular light pattern produced by another embodiment of the invention is depicted in FIG. 13, which is a schematic pupilgram representation of the FIG. 14 pupilgram pattern.

Additional advantages will become apparent to those skilled in the art from the following detailed description read in conjunction with the appended claims and the drawings attached hereto.

BRIEF DESCRIPTION OF THE DRAWINGS

FIG. 3 depicts two different conventional optical elements for exposing a photoresist layer over a semiconductor wafer;

It should be emphasized that the drawings herein, unless specified as such, may not be to exact scale and are schematic representations. The drawings are not intended to portray the specific parameters, materials, particular uses, or the structural details of the invention, which can be determined by one of skill in the art by examination of the information herein. Further, various embodiments of the present invention may be used as either a "DOE" or a "blade," and these terms, except where noted, may be generally used interchangeably with respect to various embodiments of the present invention and are collectively referred to herein as a "light mask." It is established that blades are typically used for testing a particular pattern of a light mask and DOE's are used during semiconductor device manufacturing as a light mask.

DETAILED DESCRIPTION OF THE PREFERRED EMBODIMENT

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing.

Figure 1:
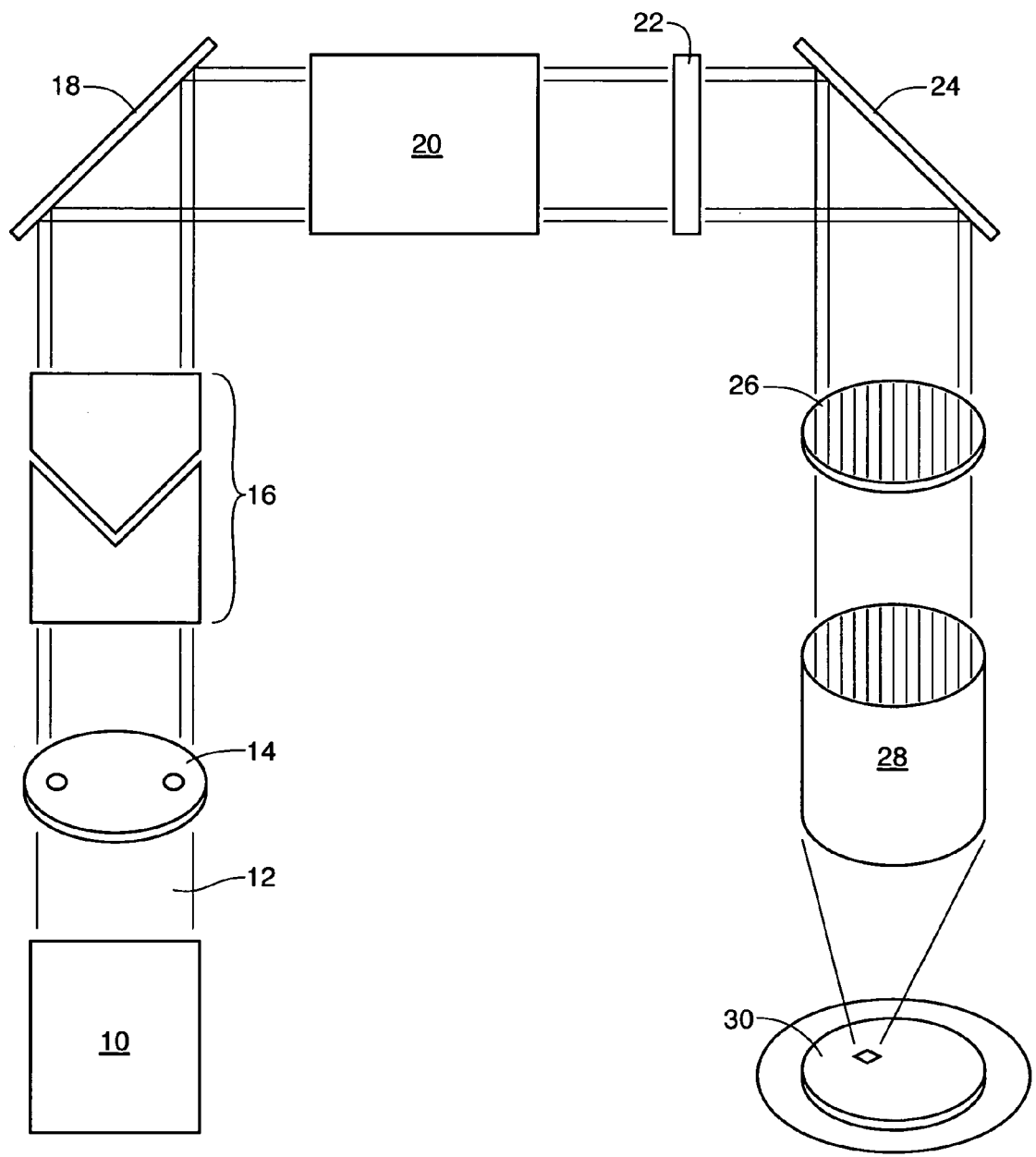
FIG. 1 depicts a conventional optical lithography apparatus comprising a dipole optical element exposing vertical lines.
Figure 2:
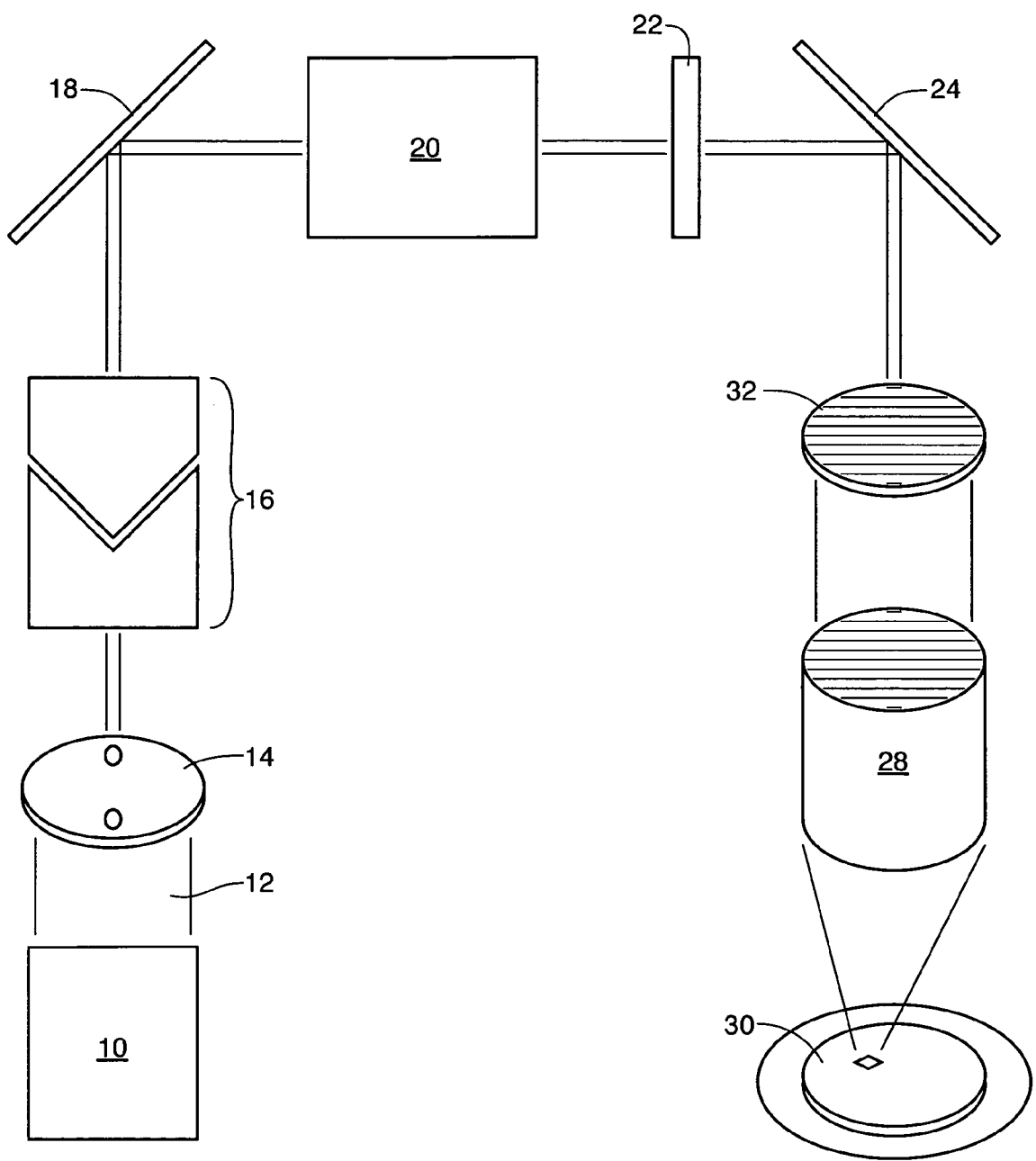
FIG. 2 depicts a conventional optical lithography apparatus similar to FIG. 1, except that the dipole optical element has been rotated to expose horizontal lines.
Figure 4:
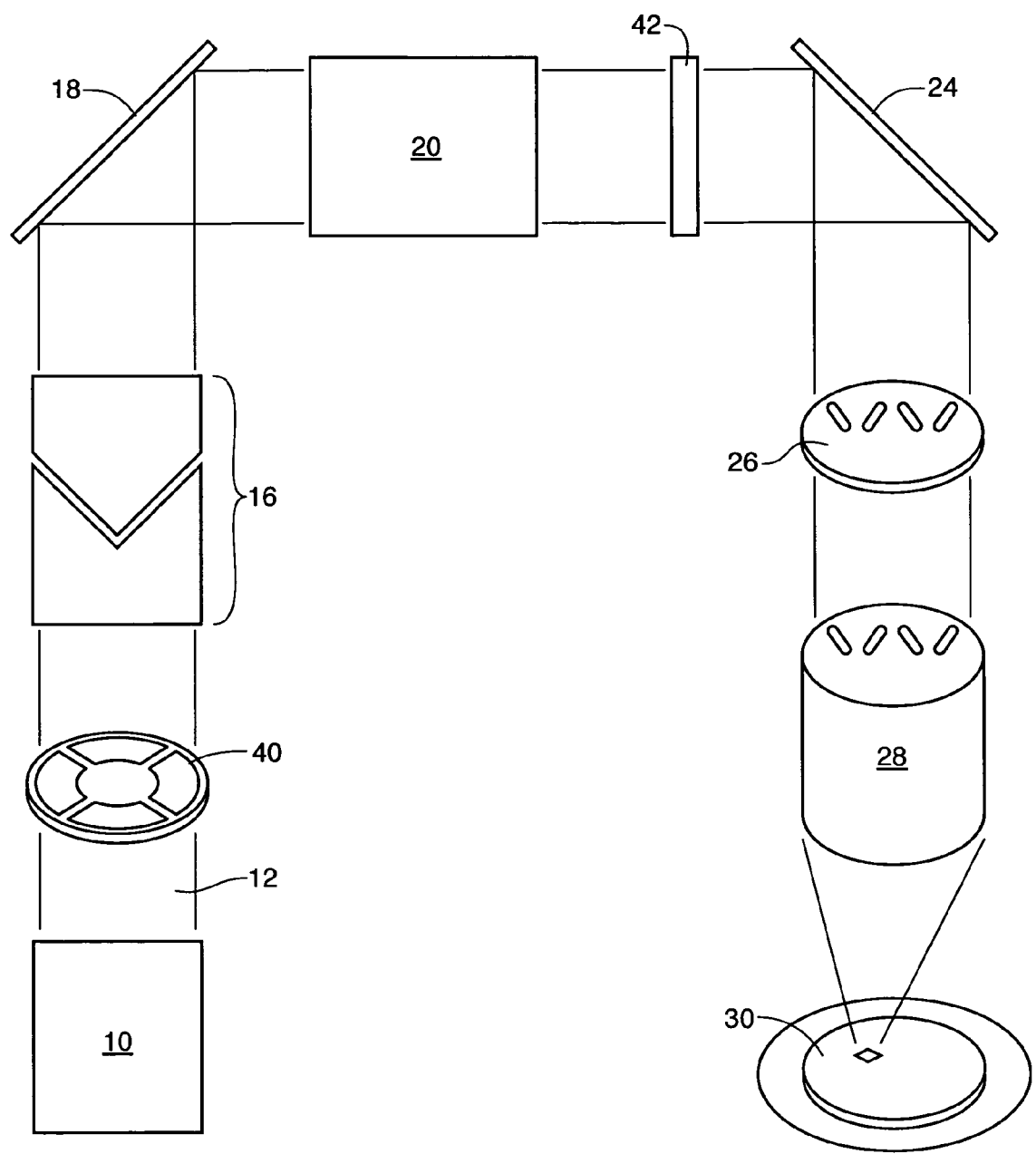
FIG. 4 depicts an optical lithography apparatus comprising both a diffused optical element (DOE) and a blade, either of which may comprise an embodiment of the invention to shape the output of the illuminator.

A first embodiment of the invention is depicted in FIG. 4 which illustrates an off-axis illumination apparatus comprising an illuminator 10 which outputs a coherent light source 12 to an inventive diffused optical element (DOE) 40 which shapes the light beam 12 to a pattern customized to the pattern on the reticle 26. After light beam 12 passes through DOE 40, it may pass through a zoom axicon 16 which may scale the pattern to a larger or smaller size. A first reflector 18 may change the direction of the light, depending on the equipment used, which then passes through an optical homogenizer 20 to normalize the intensity of the light across the beam. The DOE may be located at the location depicted by blade 42 rather than at DOE location depicted at 40. Only one of blade aperture 40 and diffractive optical element 42 depicted in FIG. 4 will typically be used, although both are illustrated. Further, the blade or DOE, if workable, may be placed at another location between the light source 10 and the wafer 30. A second reflector 24 may change the direction of the beam, depending on the equipment used. The beam then passes through reticle 26, through lens 28, and finally exposes photoresist (not individually depicted) on wafer 30.

Figure 5:
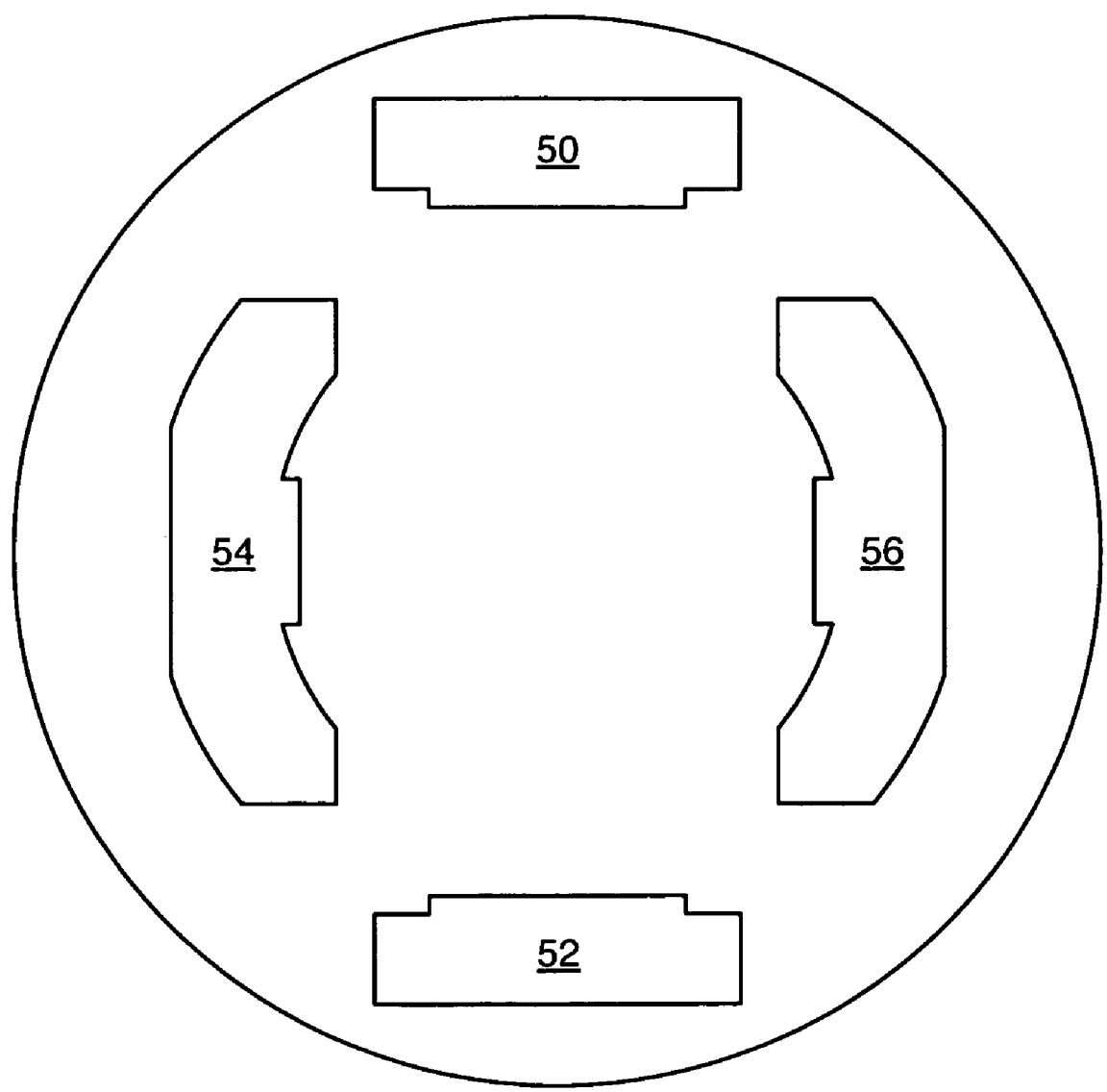
FIG. 5 depicts a first shaped DOE or blade of a first embodiment of the invention.
Figure 6:
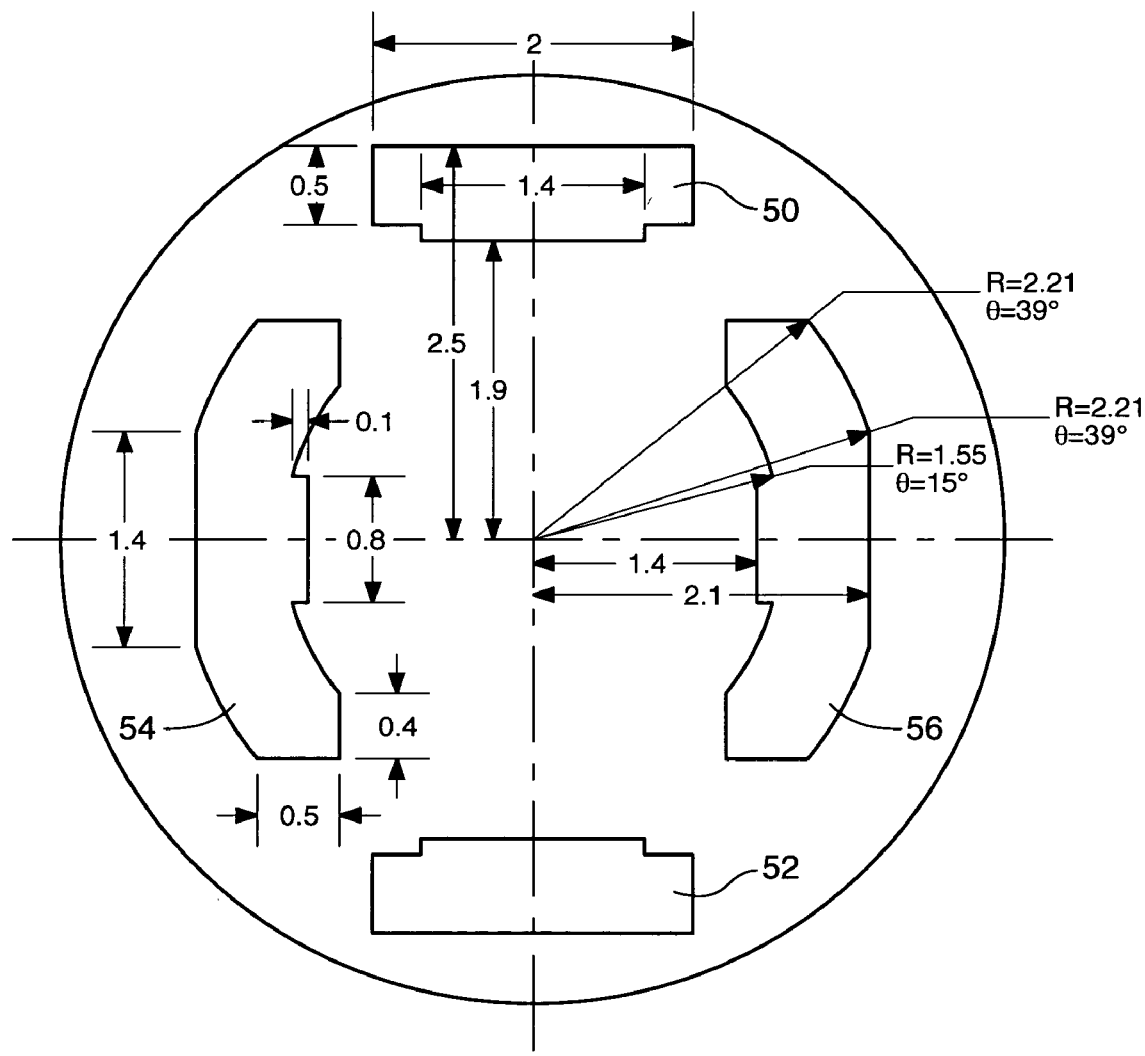
FIG. 6 depicts the FIG. 5 DOE or blade and includes dimensions of a particular embodiment.

FIGS. 5 and 6 are scale drawings depicting a DOE or blade having a particular inventive pattern embodiment which may be used during the patterning of features during optical lithography. FIG. 6 depicts the FIG. 5 structure of a particular size. The dimensions shown in FIG. 6, unless otherwise labeled, are in inches. The DOE depicted is about 120 millimeters in diameter and for use with a model/800 scanner available from ASML Lithography, Inc. headquartered in Veldhoven, the Netherlands. The DOE or blade in this embodiment has four openings located about a central axis. The first 50 and second 52 openings are substantially rectangular equidistance and mirror images about the central axis. As illustrated, the first 50 and second 52 openings can include a step on the inside wall, and the DOE or blade may be any workable size generally to scale with the depiction of FIG. 5. FIG. 6 depicts an embodiment of a particular size, wherein the first 50 and second 52 openings are 2.0×0.5 inches, with a 1.4×0.1 inch step. The closest edges of the openings are located about 1.9 inches from the central axis. It will be appreciated by those skilled in the art with the benefit of the present description that the dimensions and locations of the openings can be optimized without departing from the present invention.

The third 54 and fourth 56 openings are generally arc-shaped. These openings are equidistance and mirror images about the central axis. As illustrated, the third 54 and fourth 56 openings can include a step on the inside wall and a flat edge on the outside radius. In the FIG. 6 embodiment, the third 54 and fourth 56 openings have an arc length of about 78 degrees and are located about 1.4 in from the central axis. Again, it will be appreciated by those skilled in the art with the benefit of the present description that the dimensions and locations of the openings 50, 52, 54, and 56 can be optimized without departing from the present invention.

Figure 8:
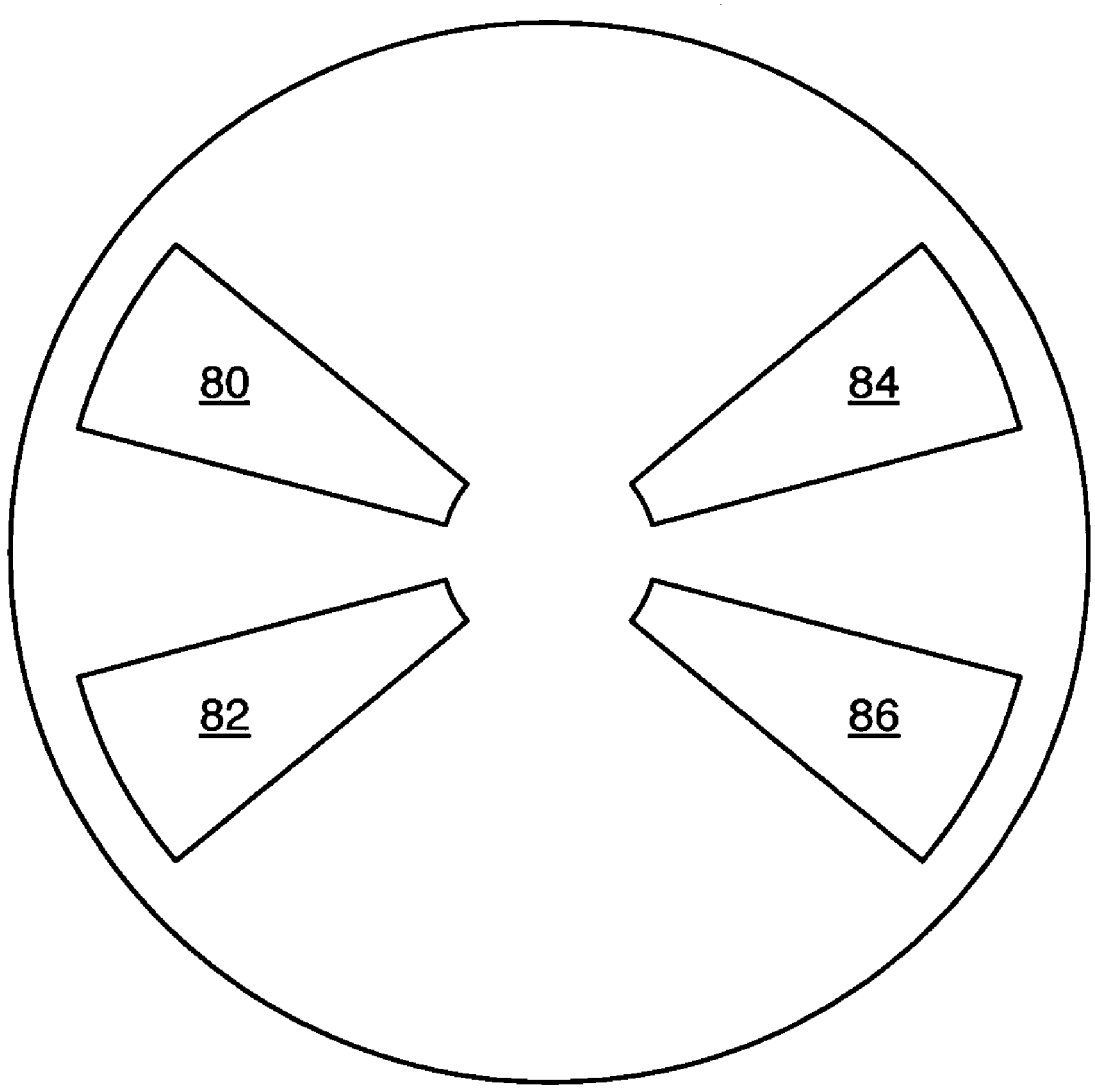
FIG. 8 depicts a second shaped DOE or blade of a second embodiment of the invention.
Figure 11:
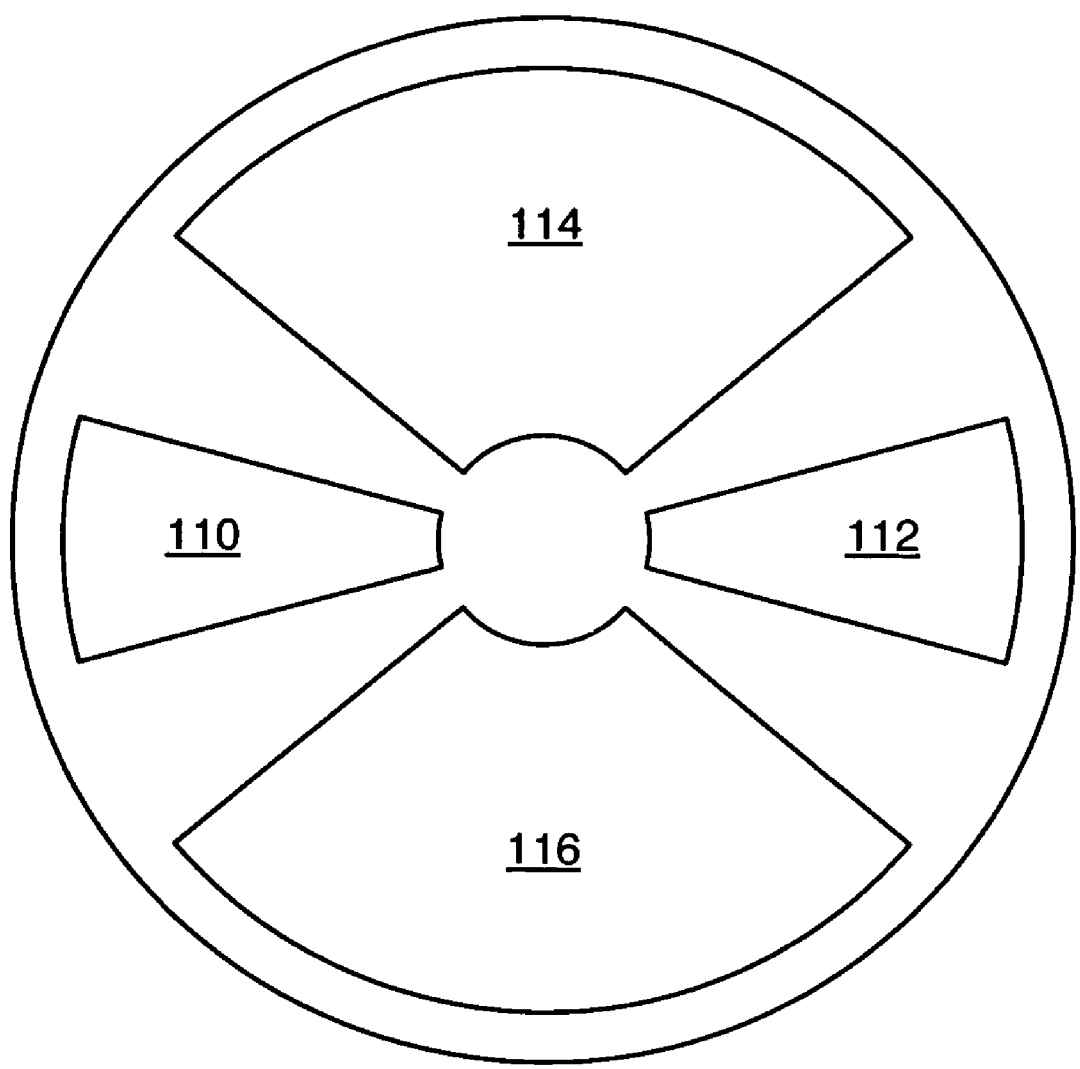
FIG. 11 depicts a third shaped DOE or blade of a third embodiment of the invention.

Depending on the particular equipment, the size of the DOE's depicted in FIGS. 5, 8, and 11 herein may change but the scale will remain about the same. In general, the DOE's or blades for current technology, depending on the equipment, will vary less than about ±10% of that depicted in FIGS. 5, 8, and 11, and more preferably to within about ±5% of that depicted. The DOE's of FIGS. 5, 6, 8, 9, 11 and 12 are different from a quadrupole element in that the openings form at least two different shapes, while all four openings within a quadrupole element are the same. Further, the openings in the inventive DOE's are customized for a particular pattern, and for different patterns the openings must also be modified. Additionally, each individual opening is not radially symmetrical as it is with a quadrupole element.

The DOE depicted in FIG. 5 is particularly useful for exposing patterns which have a very tight pitch in one direction and a less stringent but still significant pitch at between about 45° to about 90° to the first pitch. Such a structure may include a field of container capacitors 70 such as that depicted in FIG. 7, wherein the pitch 72 of the container capacitors 70 in the x-direction is about 0.189 micron (μ) with a spacing 74 between capacitors of about 0.080μ, and the pitch 76 in the y-direction is about 0.284μ with a spacing between capacitors 78 of about 0.080μ. It can be seen that the spacing 80 between capacitors at 45° to the FIG. 7 orientation is larger than at either the x- or y-directions. The DOE of FIG. 5 is oriented such that the horizontal axis of the DOE is aligned to the horizontal axis of the FIG. 7 orientation. The DOE of FIG. 5 may improve the depth of focus (DOF) and the normalized image log-slope (NILS) of the process, as well as the pattern fidelity.

In contrast to the optical element of the optical proximity correction RET, the DOE's of the present invention are not rotated relative to the wafer. Further, the orientation of the DOE is specific (exclusive) to the pattern orientation, and will remain in a fixed orientation to the orientation of the pattern.

Figure 7:
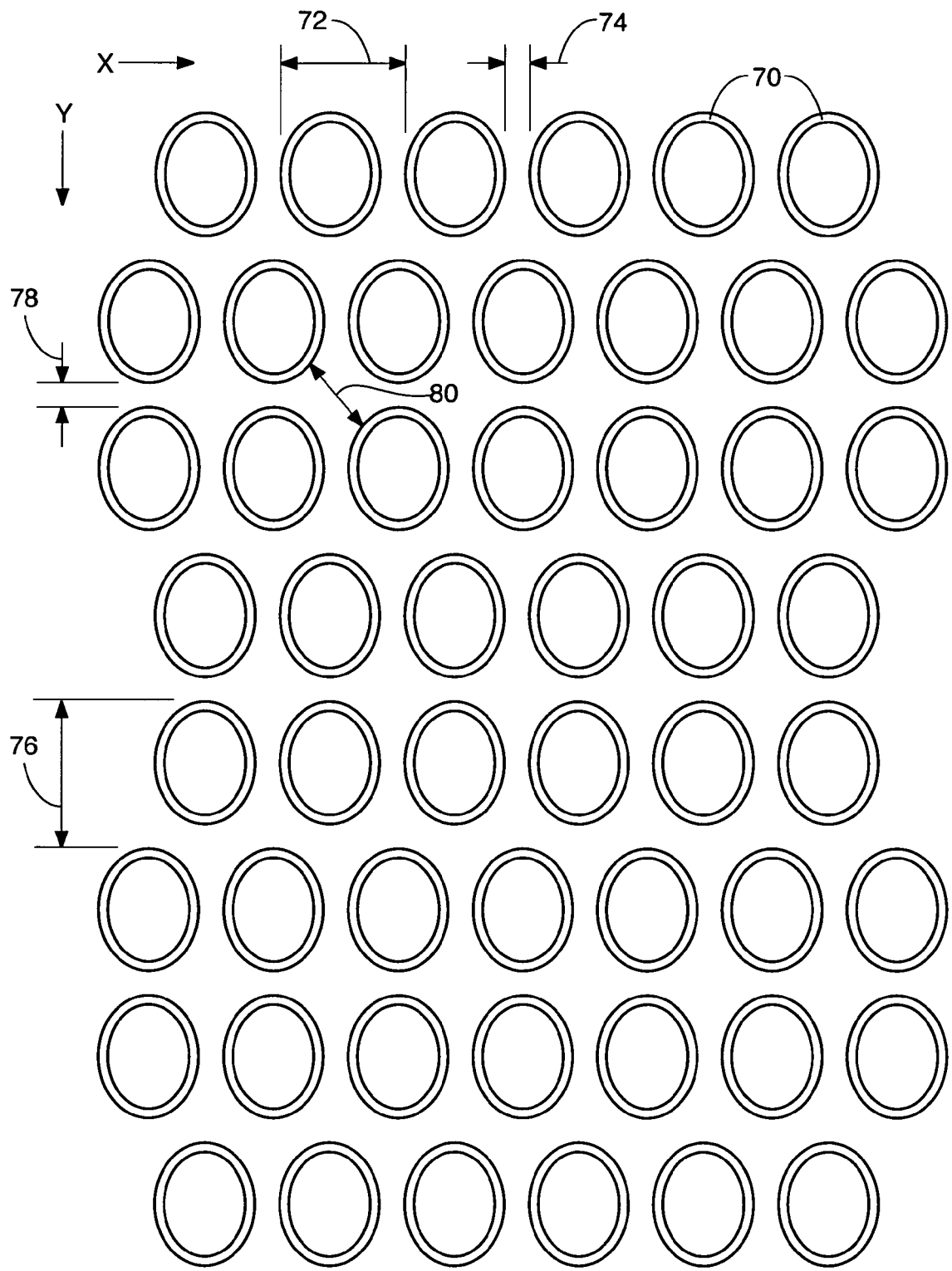
FIG. 7 depicts a field of container capacitors which may be formed using the DOE or blade of either FIG. 5 or FIG. 8.
Figure 9:
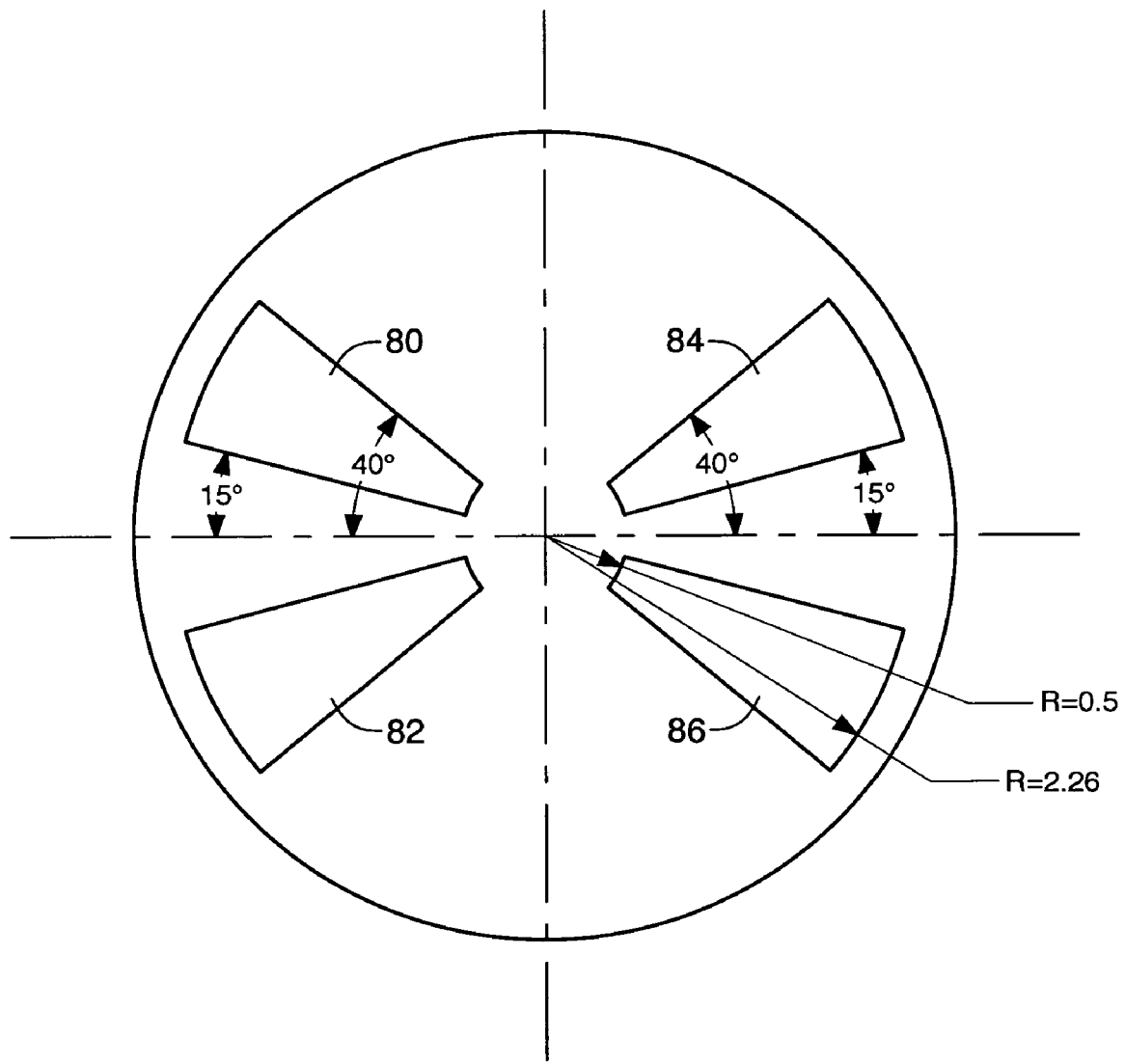
FIG. 9 depicts the FIG. 8 DOE or blade and includes dimensions of a particular embodiment.

A second DOE or blade embodiment is depicted in FIG. 8 may also be useful for exposing a pattern similar to FIG. 7. This DOE is used in conjunction with the annulus 38 of FIG. 3 which removes a portion of the light pattern either before or after the light passes through the DOE of FIG. 8 and results in a pupilgram similar to that schematically represented in FIG. 10. A DOE or blade having particular dimensions is depicted in FIG. 9. The DOE or blade of FIG. 8 comprises four openings 80, 82, 84, and 86 which are mirror images about both the horizontal and vertical axes of FIG. 8. As depicted in FIG. 9, each opening is defined by a first arc which is half an inch from the intersection of the vertical and horizontal axes, and a second arc which is 2.26 inches from the intersection. The openings 80, 82 84, and 86 are each further defined by a first edge running along 15° from the horizontal axis, and a second edge running along 40° from the horizontal axis. These openings are repeated in each quadrant of the DOE, with exactly one opening in each quadrant.

Figure 10:
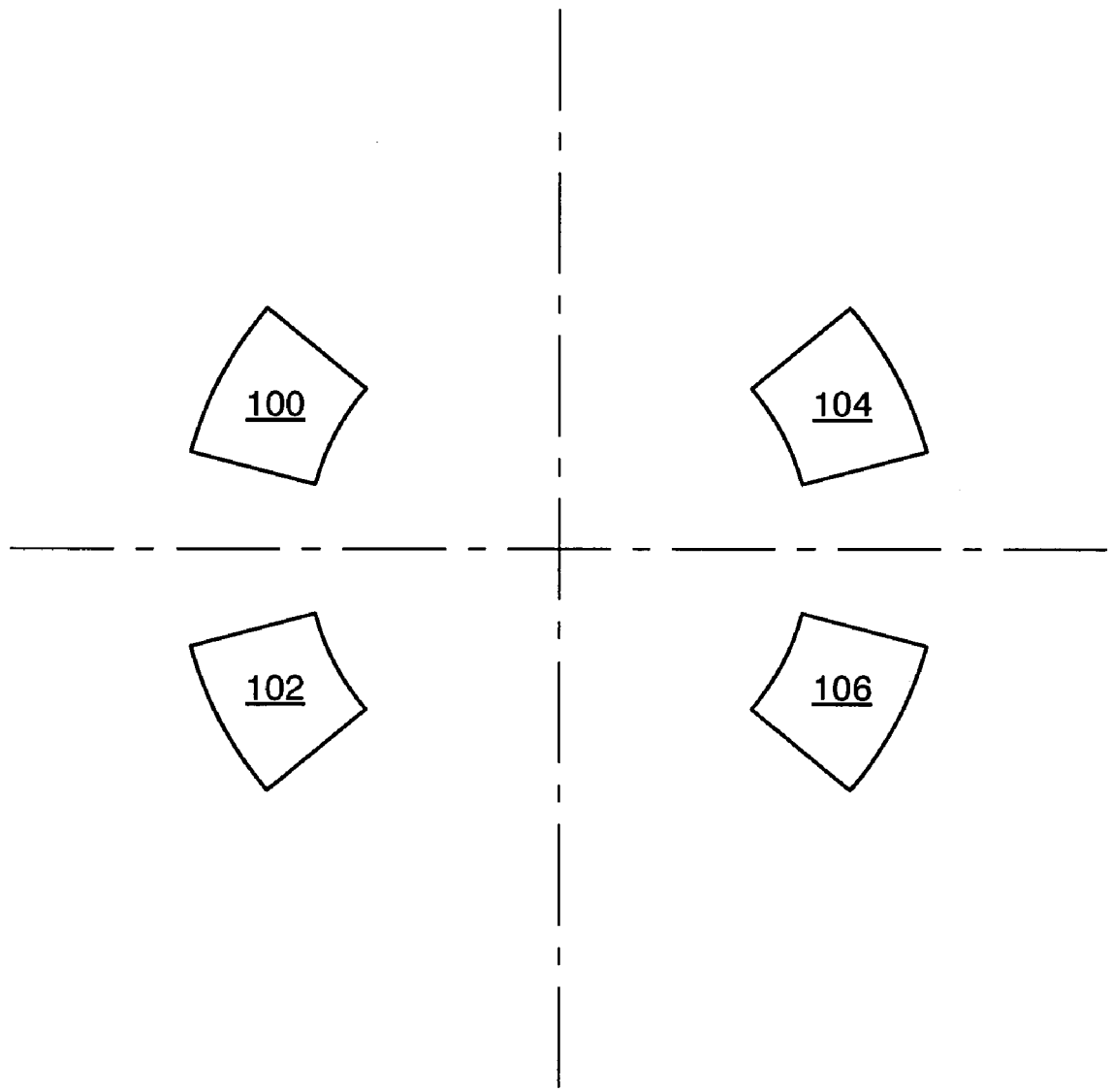
FIG. 10 is a schematic depiction of a light pattern similar to that which may be produced by passing a light source through both the DOE or blade of FIG. 8 and an annulus similar to that of FIG. 3.

The pupilgram of FIG. 10 comprises first 100 and second 102 openings which are mirror images across a horizontal axis, and third 104 and fourth 106 openings which are mirror images of the first 100 and second 102 openings across a vertical axis. Each of the four openings sweeps about 25° (±2°), with a dead zone between the first 100 and second 102 openings and between the third 104 and fourth 106 openings of about 30°, A dead zone of about 100° 0 is located between the two openings above the horizontal axis, and also between the two openings below the horizontal axis. The distance of the inside and outside radii of the openings is determined by the size of the annulus used in conjunction with the DOE or blade of FIG. 8. As the sources are measured in a unit circle with a radius of 1, the inside and outside radii of the annulus used are 0.72 inches and 0.92 inches respectively, and thus the inside and outside radii of the pupilgram of FIG. 10 are 0.72σ and 0.92σ.

Figure 12:
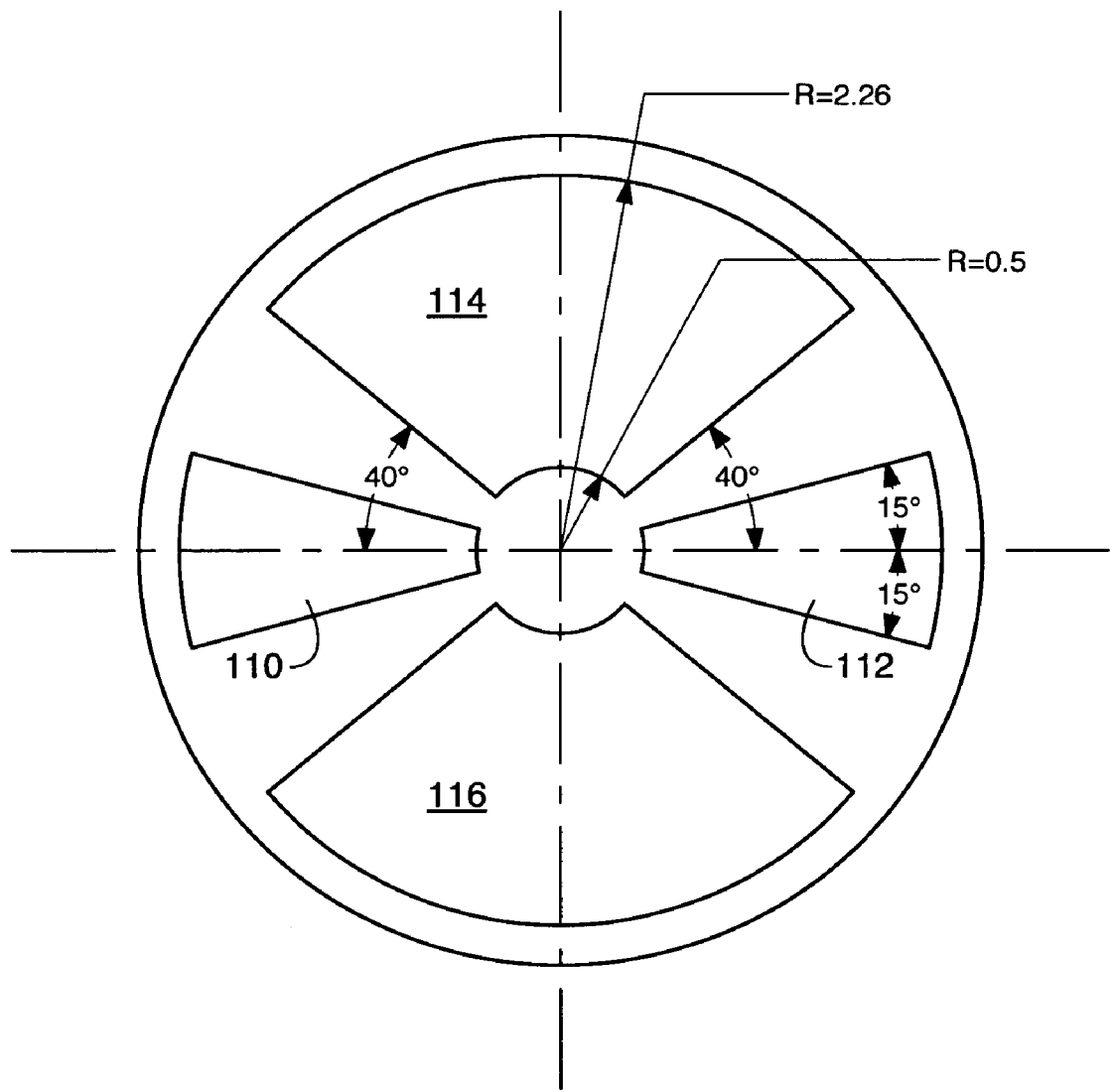
FIG. 12 depicts the FIG. 11 DOE or blade and includes dimensions of a particular embodiment.

A third DOE or blade embodiment depicted in FIG. 11 is particularly useful for exposing weave patterns which may form wafer active areas, polysilicon plugs, or bit line interconnects during the formation of semiconductor devices. FIG. 12 depicts the FIG. 11 DOE or blade having a particular size. The FIG. 11 DOE, for purposes of exposing a weave pattern, is used in conjunction with an annulus, for example the annulus 38 of FIG. 3, to produce a light pattern similar to that depicted schematically in FIG. 13 (which is a reverse image of FIG. 10) and by pupilgram in FIG. 14. The light pattern of FIGS. 13 and 14 can be used to expose the weave pattern of FIG. 15 to form active areas within a semiconductor wafer, polysilicon plugs, or bit line interconnects. Using the DOE's depicted in FIGS. 8 and 11 in conjunction with an annulus rather than the high sigma annulus depicted in FIG. 3 as element 38 alone, the depth of focus (DOF) control may be increased, for example to about 0.38μ compared to 0.23μ using a high sigma annulus. The NILS may be improved to 2.00 compared to 1.50 for a high sigma annulus.

The DOE or blade in the FIG. 11 embodiment has four openings located about a central axis. The first 110 and second 112 openings are substantially arc-shaped and mirror images about the central axis. In one embodiment, the first 110 and second 112 openings are defined on first and second sides by concentric arcs having an arc length of 30 degrees and defined on third and fourth sides by nonparallel lines having a radial length extending from 0.5 to 2.26 inches from the central axis. The third 114 and fourth 116 openings are substantially arc-shaped and mirror images about the central axis. In one embodiment, the third 114 and fourth 116 openings are defined on first and second sides by concentric arcs having arc lengths of 100 degrees and are defined on third and fourth sides by nonparallel lines having a radial length extending from 0.5 to 2.26 inches from the central axis. It will be appreciated by those skilled in the art with the benefit of the present description that the dimensions and locations of the openings can be optimized without departing from the present invention.

Figure 13:
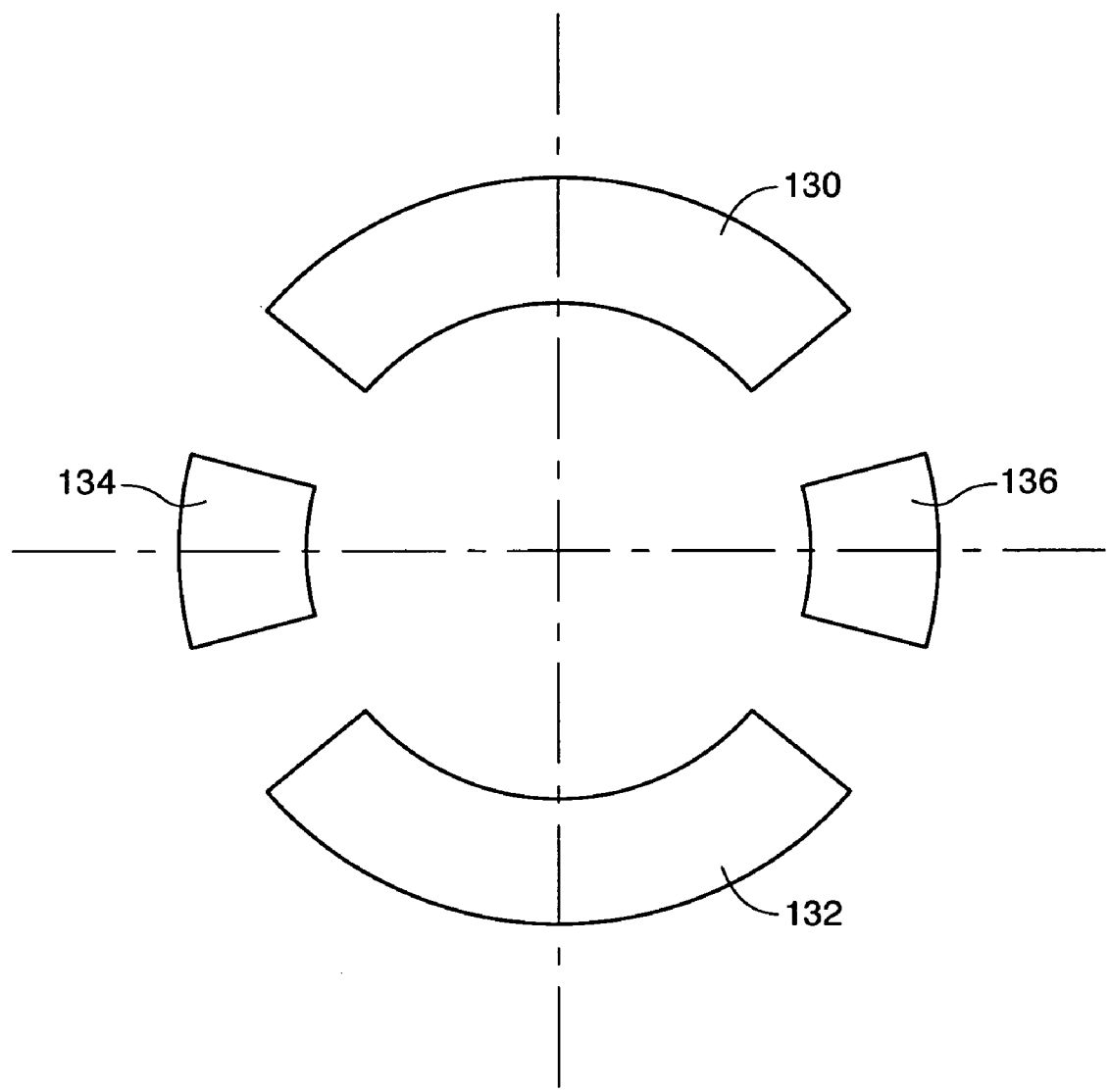
FIG. 13 is a schematic depiction of a light pattern similar to that which may be produced by passing a light source through both the DOE or blade of FIG. 11 and an annulus similar to that of FIG. 3.

The schematic pupilgram of FIG. 13 comprises first 130 and second 132 openings centered on a vertical axis and third 134 and fourth 136 openings centered on a horizontal axis. Each of the first 130 and second 132 openings sweeps about 100° (±2°), with 50° on each side of the vertical axis. Each of the third 134 and fourth 136 openings sweeps about 30° (±2°) with 15° on each side of the horizontal axis. Each of the four dead zones depicted between the openings, therefore, sweeps about 25°. The distance of the inside and outside radii of the openings is determined by the size of the annulus used in conjunction with the DOE or blade of FIGS.

8 and 11. As the sources are measured in a unit circle with a radius of 1, the inside and outside radii of the annulus used are 0.72 inches and 0.92 inches respectively, and thus the inside and outside radii of the pupilgram of FIG. 13 are 0.72σ and 0.92σ.

Figure 14:
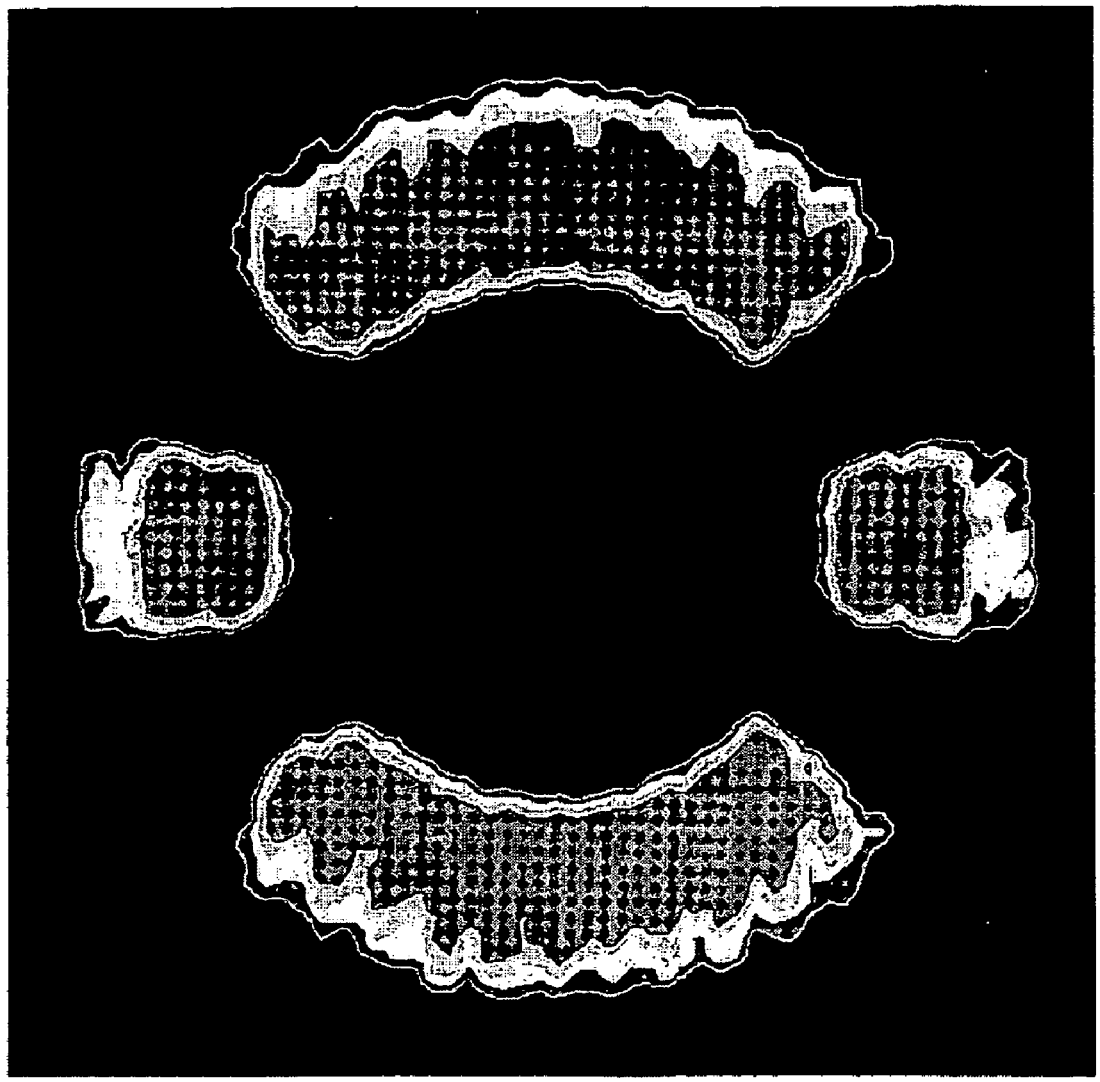
FIG. 14 is a pupilgram depicting the light pattern represented schematically by FIG. 13 which may be produced by passing a light source through both the DOE or blade of FIG. 11 and an annulus similar to that of FIG. 3.
Figure 15:
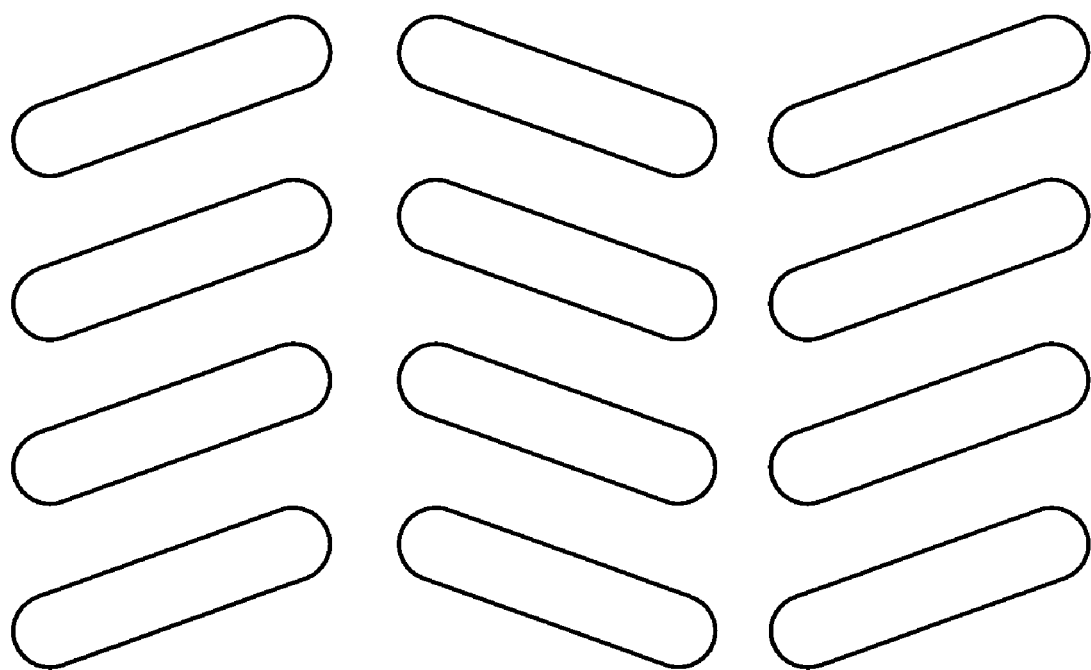
FIG. 15 depicts part of weave pattern which can define an active area, bit line interconnect, or other features that may be formed using the DOE or blade of FIG. 11.

In addition to forming a light pattern which produces the pupilgrams of FIGS. 10 and 14 with a DOE or blade, or a DOE or blade in combination with an annulus and/or a zoom axicon, it may be possible to produce a light pattern which produces these pupilgrams using a lens-only system. This may be implemented using a system that adds to the axicon pupil shaper. The adjustable lens elements follow the axicon lens unit, and shape the beam using a group of diffractive lenses to derive the desired pupil shape.

Figure 16:
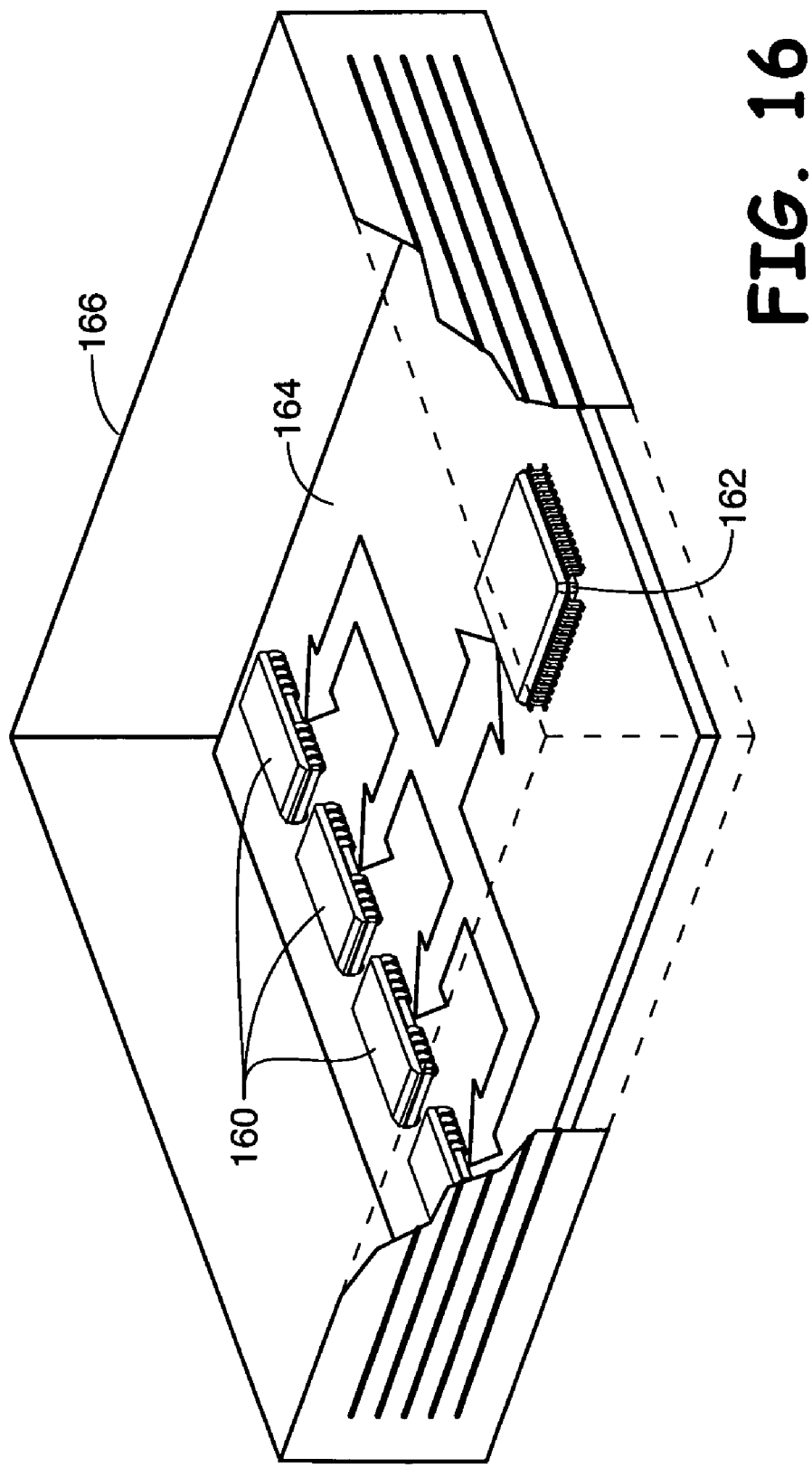
FIG. 16 is an isometric depiction of various components which may be manufactured using devices formed using an embodiment of the present invention.

As depicted in FIG. 16, a semiconductor device 160 formed in accordance with the invention may be attached along with other devices such as a microprocessor 162 to a printed circuit board 164, for example to a computer motherboard or as a part of a memory module used in a personal computer, a minicomputer, or a mainframe 166. FIG. 16 may also represent use of device 160 in other electronic devices comprising a housing 166, for example devices comprising a microprocessor 162, related to telecommunications, the automobile industry, semiconductor test and manufacturing equipment, consumer electronics, or virtually any piece of consumer or industrial electronic equipment.

Figure 17:
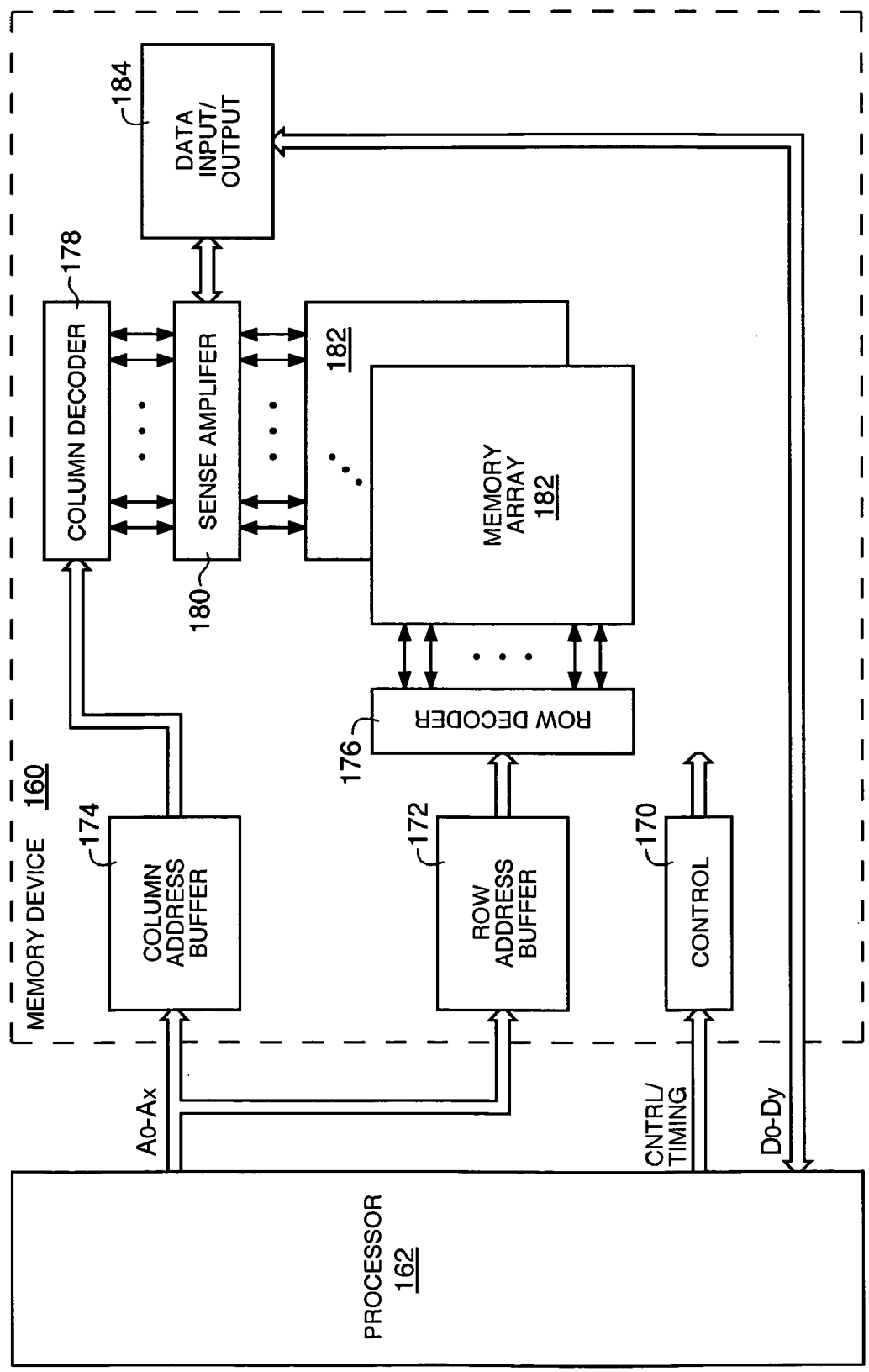
FIG. 17 is a block diagram of an exemplary use of the invention to form part of a transistor array in a memory device.

The process and structure described herein can be used to manufacture a number of different structures which comprise a structure formed using a photolithographic process. FIG. 17, for example, is a simplified block diagram of a memory device such as a dynamic random access memory having digit lines and other features which may be formed using an embodiment of the present invention. The general operation of such a device is known to one skilled in the art. FIG. 17 depicts a processor 162 coupled to a memory device 160, and further depicts the following basic sections of a memory integrated circuit: control circuitry 170; row 172 and column 174 address buffers; row 176 and column 178 decoders; sense amplifiers 180; memory array 182; and data input/output 184.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. An optical lithography patterning apparatus, comprising:
   a blade or diffused optical element comprising:
      a vertical axis and a horizontal axis;
      first and second openings therein being equidistance and mirror images about the horizontal axis, wherein the first opening has an area and the second opening has an area which is about the same as the area of the first opening; and
      third and fourth openings therein being equidistance and mirror images, each with the other, about the vertical axis, wherein the third opening has an area and the fourth opening has an area which is about the same as the area of the third opening, and wherein the areas of the third and fourth openings are substantially different than the areas of the first and second openings.

2. The optical lithography patterning apparatus of claim 1 wherein each of the first and second openings in the blade or diffused optical element has a dimension in a first direction which is about 2.0 inches and a dimension in a second direction perpendicular with the first direction which is about 0.5 inches.

3. The optical lithography patterning apparatus of claim 2 wherein said dimension in said second direction is a first dimension in said second direction and each of the first and second opening in the blade or diffused optical element has second dimension in said second direction which is about 0.6 inches and has an edge located about 1.9 inches from the horizontal axis.

4. The optical lithography patterning apparatus of claim 1 wherein each of the third and fourth openings in the blade or diffused optical element has an arc length of about 78 degrees and are located about 1.4 inches from the vertical axis.

5. The optical lithography patterning apparatus of claim 4 wherein each of the third and fourth openings in the blade or diffused optical element comprises a step on an inside wall and a flat edge on an outside radius located furthest from the vertical axis.

6. An optical lithography patterning apparatus, comprising:
   a blade or diffused optical element comprising:
      a central point;
      first and second openings therein being equidistance and mirror images, each with the other, about one of a vertical axis and horizontal axis, said first and second openings each being defined on first and second sides by concentric arcs having an arc length of 30 degrees and being further defined on third and fourth sides by first and second nonparallel lines having a radial length extending from 0.5 inches to 2.26 inches from the central point; and
      third and fourth openings therein being equidistance and mirror images, each with the other, about the other of the vertical axis and horizontal axis, said third and fourth openings each being defined on first and second sides by concentric arcs having an arc length of 100 degrees and being further defined on third and fourth sides by nonparallel lines having a radial length extending from 0.5 inches to 2.26 inches from the central point.

7. The optical lithography patterning apparatus of claim 6, wherein the central point is defined by an intersection of a vertical axis and a horizontal axis.

8. A light processing apparatus for exposing a light pattern on a photosensitive layer during the manufacture of a semiconductor device, wherein the light pattern comprises areas having first and second light intensities, wherein the first intensity is higher than the second intensity, and the pattern further comprises:
   first and second first intensity pattern elements each centered on a first axis wherein each of the first and second first intensity pattern elements sweeps about 100°, with about 50° on each side of the first axis;
   third and fourth first intensity pattern elements each centered on a second axis which is perpendicular to the first axis, wherein each of the third and fourth first intensity pattern elements sweeps about 30°, with about 15° on each side of the horizontal axis; and
   four second intensity pattern elements with each of the second intensity pattern elements sweeping about 25°, wherein each second intensity pattern element separates two adjacent first intensity pattern elements, wherein an inside radius of the first intensity pattern elements is about 0.72 σ and an outside radius of the first intensity pattern elements is about 0.92σ.

9. A light processing apparatus for exposing a light pattern on a photosensitive layer during the manufacture of a semiconductor device, wherein the light pattern comprises areas having first and second light intensities, wherein the first intensity is higher than the second intensity, and the pattern further comprises:

first and second second intensity pattern elements each centered on a first axis wherein each of the first and second second intensity pattern elements sweeps about 100°, with about 50° on each side of the first axis;

third and fourth second intensity pattern elements each centered on a second axis which is perpendicular to the first axis, wherein each of the third and fourth second intensity pattern elements sweeps about 30°, with about 15° on each side of the horizontal axis; and four first intensity pattern elements with each of the first intensity pattern elements sweeping about 25°, wherein each first intensity pattern element separates two adjacent second intensity pattern elements, wherein an inside radius of the second intensity pattern elements is about 0.72 σ and an outside radius of the second intensity pattern elements is about 0.92σ.

10. An optical lithography patterning apparatus, comprising:

a blade or diffused optical element comprising:

a vertical axis and a horizontal axis;

first and second openings therein being mirror images, each with the other, about one of the vertical and horizontal axes, and each being defined on first and second sides by concentric arcs having an arc length of 30 degrees and being further defined on third and fourth sides by first and second nonparallel lines having a radial length extending from 0.5 inches to 2.26 inches from one of the vertical axis and the horizontal axis; and third and fourth openings therein being mirror images, each with the other, about one of the vertical and horizontal axes, and each being defined on first and second sides by concentric arcs having an arc length of 100 degrees and being further defined on third and fourth sides by first and second nonparallel lines having a radial length extending from 0.5 inches to 2.26 inches from one of the vertical axis and the horizontal axis, wherein the blade or diffused optical element comprises only the first, second, third, and fourth openings therein which are adapted for the passage of light therethrough.

11. An optical lithography patterning apparatus, comprising:

a blade or diffused optical element comprising:

a vertical axis and a horizontal axis;

first and second openings therein being mirror images, each with the other, about one of the vertical and horizontal axes, and each being defined on first and second sides by concentric arcs having a first arc length and being further defined on third and fourth sides by first and second nonparallel lines having a second radial length extending from one of the vertical axis and the horizontal axis; and third and fourth openings therein being mirror images, each with the other, about one of the vertical and horizontal axes, and each being defined on first and second sides by concentric arcs having a second arc length different from the first arc length and being further defined on third and fourth sides by first and second nonparallel lines having a second radial length different from the first radial length extending from one of the vertical axis and the horizontal axis.

12. The optical lithography patterning apparatus of claim 11, wherein the blade or diffused optical element comprises only the first, second, third, and fourth openings therein which are adapted for the passage of light therethrough.

* * * * *